(12) United States Patent
Takada et al.

(10) Patent No.: US 12,211,733 B2
(45) Date of Patent: Jan. 28, 2025

(54) SUBSTRATE PROCESSING APPARATUS AND SUBSTRATE PROCESSING METHOD

(71) Applicant: EBARA CORPORATION, Tokyo (JP)

(72) Inventors: Nobuyuki Takada, Tokyo (JP); Hozumi Yasuda, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 337 days.

(21) Appl. No.: 17/759,932

(22) PCT Filed: Jan. 13, 2021

(86) PCT No.: PCT/JP2021/000794
§ 371 (c)(1),
(2) Date: Aug. 2, 2022

(87) PCT Pub. No.: WO2021/157297
PCT Pub. Date: Aug. 12, 2021

(65) Prior Publication Data
US 2023/0060135 A1   Mar. 2, 2023

(30) Foreign Application Priority Data

Feb. 6, 2020 (JP) .................................. 2020-018824

(51) Int. Cl.
*H01L 21/687* (2006.01)
*B24B 37/005* (2012.01)
(Continued)

(52) U.S. Cl.
CPC ...... *H01L 21/68728* (2013.01); *B24B 37/005* (2013.01); *B24B 37/10* (2013.01);
(Continued)

(58) Field of Classification Search
CPC . H01L 21/68728; H01L 21/304; H01L 21/68; H01L 21/67092; H01L 21/682;
(Continued)

(56) References Cited

U.S. PATENT DOCUMENTS 6,298,280 B1 * 10/2001 Bonora ................. H01L 21/681
700/218
11,735,457 B2 * 8/2023 Takada .............. H01L 21/30625
438/14
(Continued)

FOREIGN PATENT DOCUMENTS

CN    110600413 A  * 12/2019  ....... H01L 21/67259
JP    H08-335624 A    12/1996
(Continued)

OTHER PUBLICATIONS

International Search Report issued in Patent Application No. PCT/JP2021/000794 dated Mar. 16, 2021.

*Primary Examiner* — David S Posigian
*Assistant Examiner* — Michael A Gump
(74) *Attorney, Agent, or Firm* — Chrisman Gallo Tochtrop LLC

(57) ABSTRACT

A substrate processing apparatus includes a table, a pad holder, an elevating mechanism, and at least three centering mechanisms. The table is for supporting a substrate. The pad holder is for holding a polishing pad for polishing the substrate supported by the table. The elevating mechanism is for elevating the pad holder with respect to the substrate. The at least three centering mechanisms are for pushing the substrate supported by the table in a center direction of the table to position the substrate. The at least three centering mechanisms each include a rotation shaft arranged in a peripheral area of the table and a centering member mounted to the rotation shaft.

14 Claims, 10 Drawing Sheets

(51) Int. Cl.
*B24B 37/10* (2012.01)
*B24B 41/06* (2012.01)
*B24B 49/02* (2006.01)
*H01L 21/304* (2006.01)
*H01L 21/67* (2006.01)
*H01L 21/68* (2006.01)

(52) U.S. Cl.
CPC .............. *B24B 41/06* (2013.01); *B24B 49/02* (2013.01); *H01L 21/304* (2013.01); *H01L 21/67092* (2013.01); *H01L 21/68* (2013.01)

(58) Field of Classification Search
CPC ....... B24B 37/005; B24B 37/10; B24B 37/04; B24B 37/042; B24B 37/07; B24B 37/105; B24B 37/27; B24B 37/30; B24B 37/34; B24B 37/345; B24B 37/32; B24B 41/06; B24B 41/067; B24B 49/02; B24B 49/04; B24B 49/045; B24B 7/228; B24B 9/065; B24B 27/0069; B23Q 3/183; B23Q 3/186
USPC ................ 451/364; 438/14; 414/222.01
See application file for complete search history.

(56) References Cited

U.S. PATENT DOCUMENTS

| | | | |
|---|---|---|---|
| 11,911,872 B2* | 2/2024 | Takada | B24B 49/04 |
| 2004/0047720 A1* | 3/2004 | Lerner | H01L 21/68 |
| | | | 414/781 |
| 2008/0200100 A1* | 8/2008 | Takahashi | H01L 21/67219 |
| | | | 438/692 |
| 2009/0305612 A1* | 12/2009 | Miyazaki | H01L 21/67742 |
| | | | 134/32 |
| 2015/0241778 A1 | 8/2015 | Kato et al. | |
| 2019/0143479 A1* | 5/2019 | Nishida | B24B 37/107 |
| | | | 451/246 |
| 2019/0333798 A1* | 10/2019 | Tanabe | B65G 47/91 |

FOREIGN PATENT DOCUMENTS

| | | |
|---|---|---|
| JP | H10-116882 A | 5/1998 |
| JP | 2008-537316 A | 9/2008 |
| JP | 2019-091766 A | 6/2019 |
| TW | 201732456 A | 9/2017 |
| TW | 201829122 A | 8/2018 |

* cited by examiner

SUBSTRATE PROCESSING APPARATUS AND SUBSTRATE PROCESSING METHOD

TECHNICAL FIELD

This application relates to a substrate processing apparatus and a substrate processing method. This application claims priority from Japanese Patent Application No. 2020-18824 filed on Feb. 6, 2020. The entire disclosure including the descriptions, the claims, the drawings, and the abstract in Japanese Patent Application No. 2020-18824 is herein incorporated by reference.

BACKGROUND ART

There is a Chemical Mechanical Polishing (CMP) apparatus as one kind of a substrate processing apparatus used for a semiconductor processing process. The CMP apparatus can be roughly classified into "a face-up type (a system in which a surface to be polished of a substrate faces upward)" and "a face-down type (a system in which a surface to be polished of a substrate faces downward)" depending on a direction that the surface to be polished of the substrate faces.

A face-up type CMP apparatus is installed on a table with a surface to be polished of the substrate facing upward and is configured to polish the substrate by bringing a polishing pad having a diameter smaller than that of the substrate in contact with the substrate and swinging the polishing pad while rotating the polishing pad. Such CMP apparatus positions the substrate at the center of the table (centering) when installing the substrate on the table. In regard to the positioning of the substrate, PTL 1 discloses positioning the substrate at the center of a plurality of centering pins by bringing the plurality of centering pins arranged in a peripheral area of the substrate in contact with a peripheral edge of the substrate and applying a pushing force.

CITATION LIST

Patent Literature

PTL 1: Japanese Unexamined Patent Application Publication No. 2008-537316

SUMMARY OF INVENTION

Technical Problem

However, in the technique described in PTL 1, a positioning accuracy of the substrate in a case where the substrate including a deformed portion such as an orientation flat or a notch is not pre-aligned is not considered.

That is, the technique described in PTL 1 is based on an assumption that the substrate is pre-aligned such that the deformed portion of the substrate points to a predetermined direction, and the positioning is performed on the pre-aligned substrate using the plurality of centering pins. Accordingly, in a case where the substrate is not pre-aligned, the positioning of the substrate may possibly be displaced.

Therefore, one object of this application is to improve a positioning accuracy of a substrate including a deformed portion that is not pre-aligned.

Solution to Problem

According to one embodiment, there is disclosed a substrate processing apparatus that includes a table, a pad holder, an elevating mechanism, and at least three centering mechanisms. The table is for supporting a substrate. The pad holder is for holding a polishing pad for polishing the substrate supported by the table. The elevating mechanism is for elevating the pad holder with respect to the substrate. The at least three centering mechanisms are for pushing the substrate supported by the table in a center direction of the table to position the substrate. The at least three centering mechanisms each include a rotation shaft arranged in a peripheral area of the table and a centering member mounted to the rotation shaft. The centering member includes a first contact portion configured to contact the substrate when the rotation shaft rotates in a first direction, and a second contact portion configured to contact the substrate when the rotation shaft rotates in a second direction opposite to the first direction.

DESCRIPTION OF EMBODIMENTS

Figure 1:
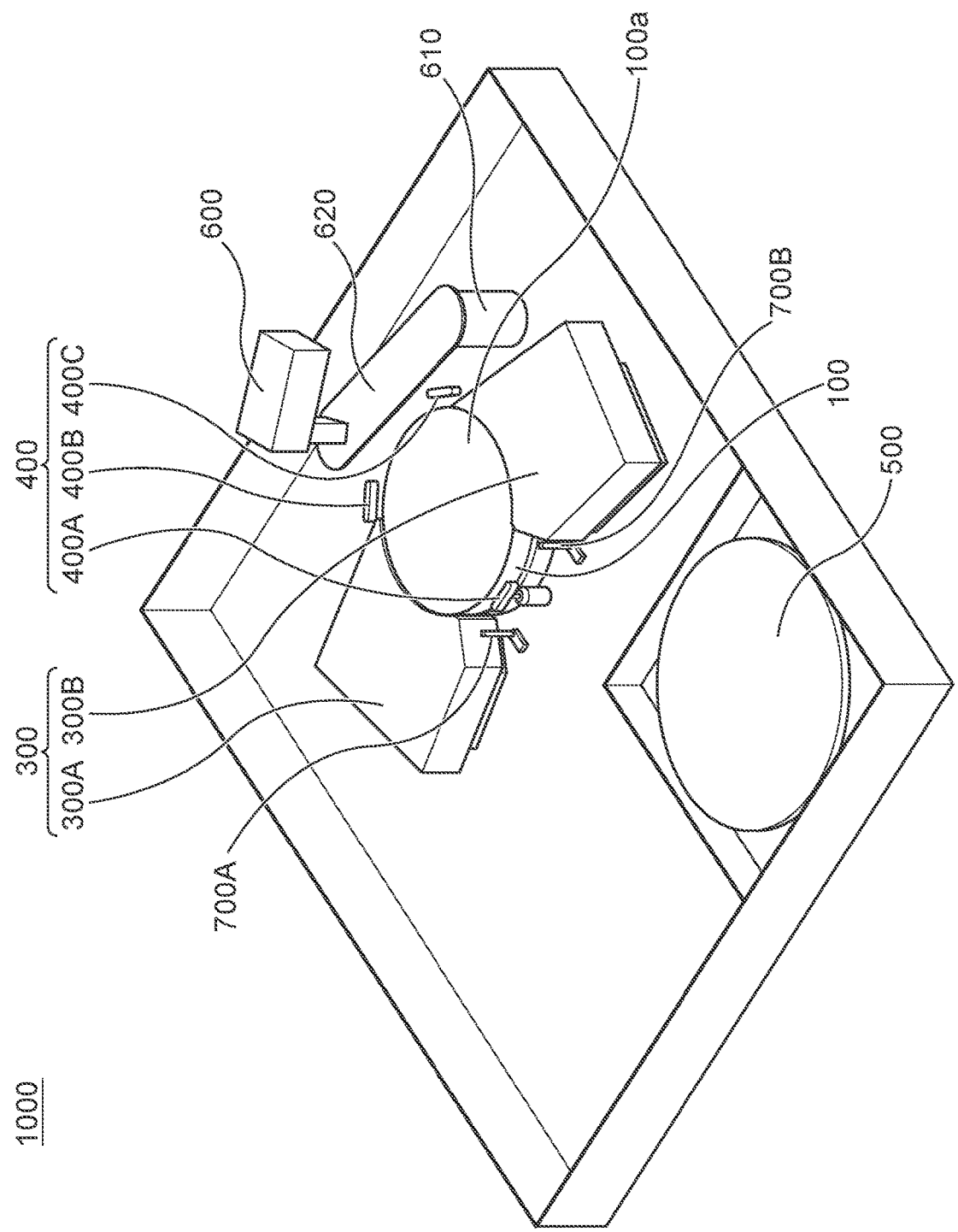
FIG. 1 is a perspective view schematically illustrating an overall configuration of a substrate processing apparatus according to one embodiment.

The following describes embodiments of a substrate processing apparatus and a substrate processing method according to the present invention with reference to the attached drawings. In the attached drawings, identical or similar reference numerals are attached to identical or similar components, and overlapping description regarding the identical or similar components may be omitted in the description of the respective embodiments. Features illustrated in the respective embodiments are applicable to other embodiments in so far as they are consistent with one another.

Figure 2:
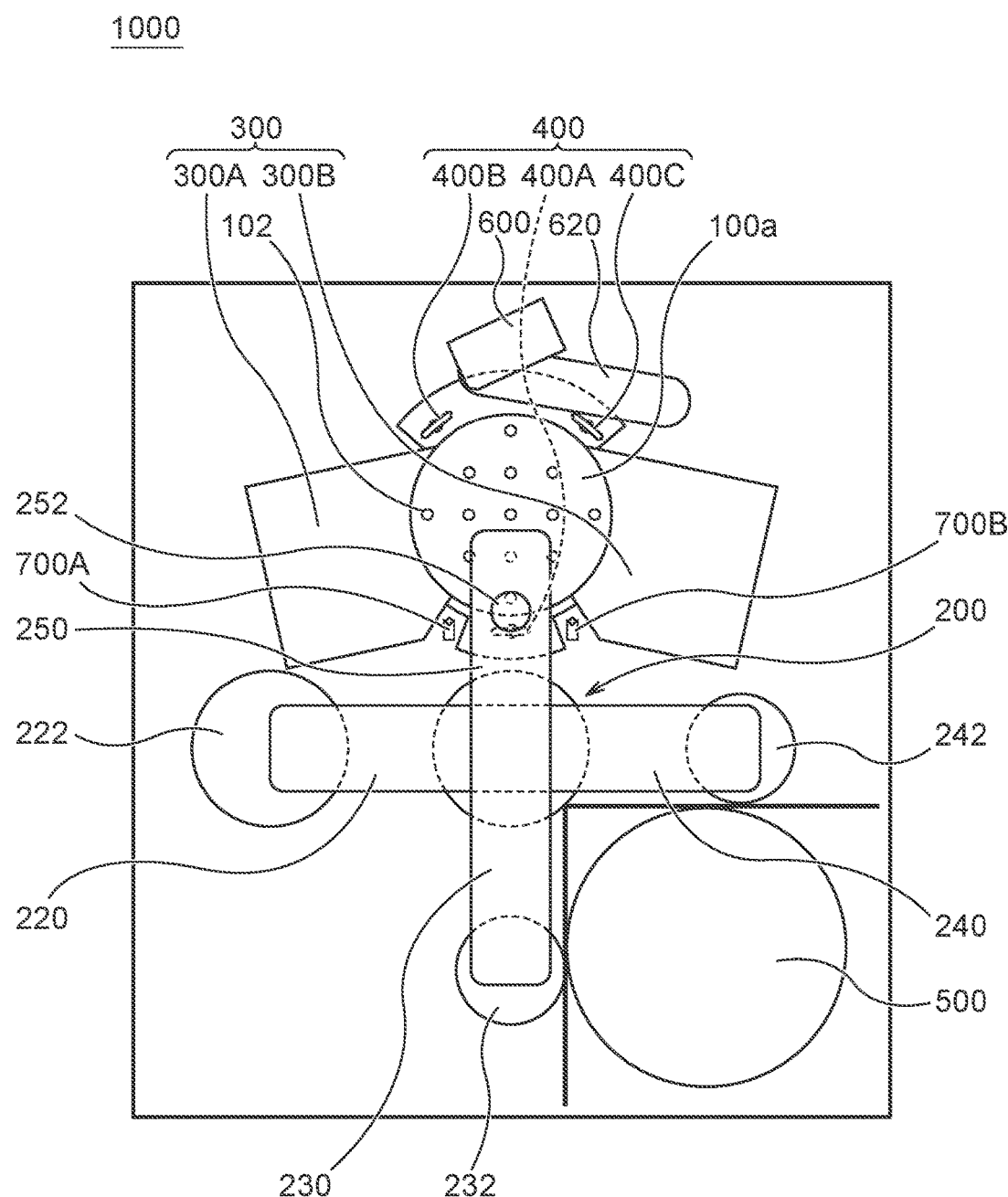
FIG. 2 is a plan view schematically illustrating an overall configuration of the substrate processing apparatus according to the one embodiment.

FIG. 1 is a perspective view schematically illustrating an overall configuration of a substrate processing apparatus according to one embodiment. FIG. 2 is a plan view schematically illustrating the overall configuration of the substrate processing apparatus according to the one embodiment. A substrate processing apparatus 1000 illustrated in FIG. 1 and FIG. 2 includes a table 100, a multi-axis arm 200, supporting members 300A, 300B, centering mechanisms 400A, 400B, 400C, a dresser 500, a film thickness measuring instrument (end point detector) 600, and cleaning nozzles 700A, 700B.

<Table>

The table 100 is a member for supporting a substrate WF as a process target. In the one embodiment, the table 100 includes a support surface 100a for supporting the substrate WF and is configured to be rotatable by a driving mechanism, such as a motor (not illustrated). The support surface 100a has a plurality of holes 102, and the table 100 is configured to be capable of performing vacuum suction on the substrate WF via the holes 102.

<Multi-Axis Arm>

Figure 3:
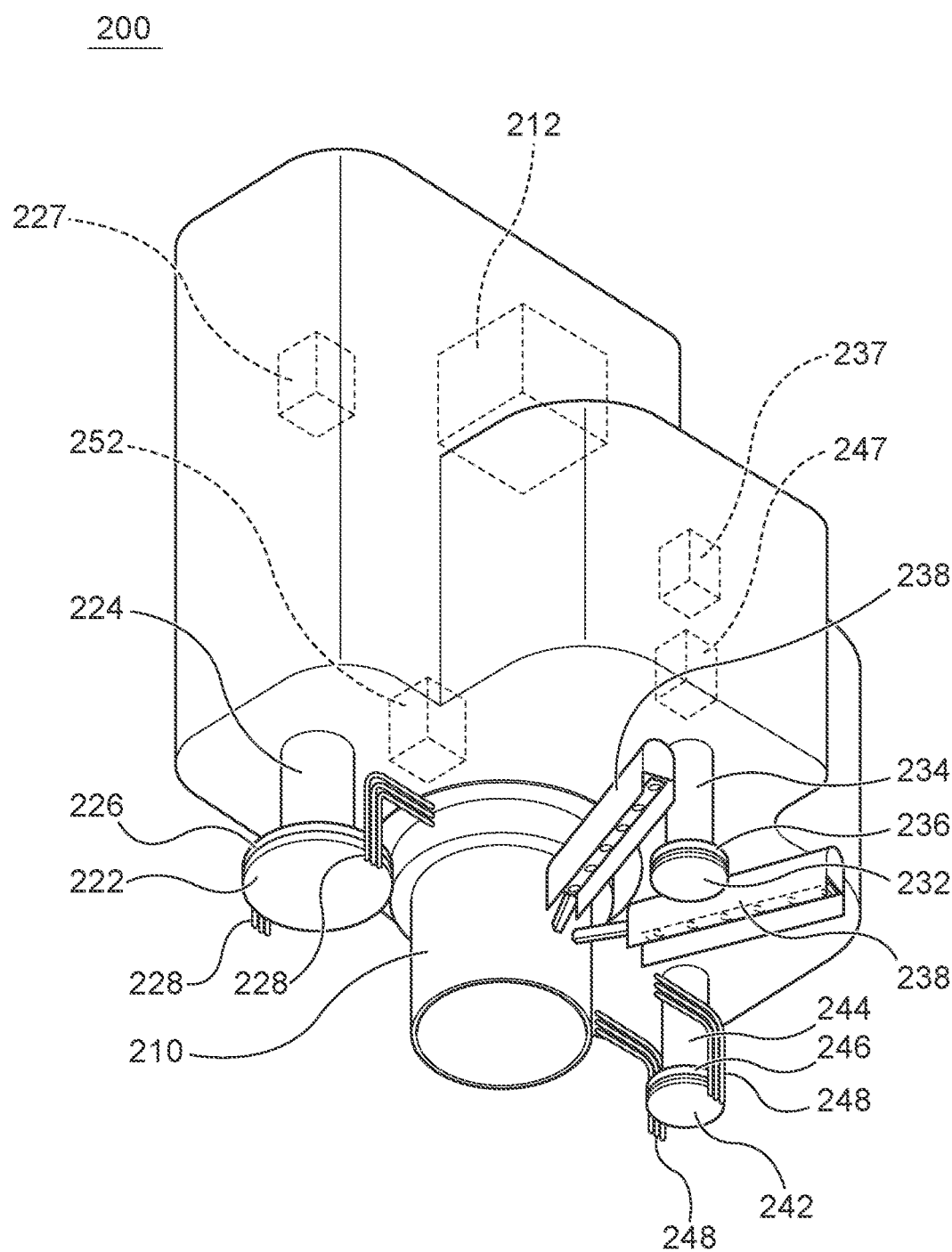
FIG. 3 is a perspective view schematically illustrating a multi-axis arm according to the one embodiment.

FIG. 3 is a perspective view schematically illustrating the multi-axis arm according to the one embodiment. As illustrated in FIG. 2 and FIG. 3, the multi-axis arm 200 is a member that holds a plurality of processing tools for performing various processes on the substrate WF supported by the table 100 and is arranged adjacent to the table 100. The multi-axis arm 200 in this embodiment is configured to hold a large-diameter polishing pad 222 for polishing the substrate WF, a cleaning tool 232 for cleaning the substrate WF, a small-diameter polishing pad 242 for finish polishing the substrate WF, and a photographing member (camera) 252 for measuring a diameter of the substrate WF.

Specifically, the multi-axis arm 200 includes a swing shaft 210 extending in a direction perpendicular to the substrate WF (height direction), a rotation drive mechanism 212, such as a motor, that rotatably drives the swing shaft 210, a first arm 220, a second arm 230, a third arm 240, and a fourth arm 250 supported by the swing shaft 210 and radially arranged around the swing shaft 210. To the first arm 220, a rotation shaft 224 that extends in the height direction is mounted, and to a distal end of the rotation shaft 224, a pad holder 226 is mounted. The large-diameter polishing pad 222 is held to the pad holder 226. The pad holder 226 is movable up and down in the height direction with respect to the substrate WF by an elevating mechanism 227 configured of a driving mechanism, such as an air cylinder. To the second arm 230, a rotation shaft 234 that extends in the height direction is mounted, and to a distal end of the rotation shaft 234, a cleaning tool holder 236 is mounted. The cleaning tool 232 is held to the cleaning tool holder 236. The cleaning tool holder 236 is movable up and down in the height direction with respect to the substrate WF by an elevating mechanism 237 configured of a driving mechanism, such as an air cylinder. To the third arm 240, a rotation shaft 244 that extends in the height direction is mounted, and to a distal end of the rotation shaft 244, a pad holder 246 is mounted. The small-diameter polishing pad 242 is held to the pad holder 246. The pad holder 246 is movable up and down in the height direction with respect to the substrate WF by an elevating mechanism 247 configured of a driving mechanism, such as an air cylinder. To the fourth arm 250, the photographing member 252 is held.

The first arm 220 is configured to further hold nozzles 228 in addition to the polishing pad 222. The nozzles 228 are disposed on both sides in the swinging direction of the polishing pad 222 across the polishing pad 222, and are configured to discharge a polishing liquid or a cleaning water to the substrate WF. The second arm 230 is configured to further hold atomizers 238 in addition to the cleaning tool 232. The atomizers 238 are disposed on both sides in the swinging direction of the cleaning tool 232 across the cleaning tool 232, and are configured to discharge a liquid, such as pure water, to the substrate WF. The third arm 240 is configured to further hold nozzles 248 in addition to the polishing pad 242. The nozzles 248 are disposed on both sides in the swinging direction of the polishing pad 242 across the polishing pad 242, and are configured to discharge a polishing liquid or a cleaning water to the substrate WF.

As illustrated in FIG. 2, in this embodiment, the first arm 220, the second arm 230, the third arm 240, and the fourth arm 250 radially extend around the swing shaft 210 while being displaced counterclockwise by 90 degrees in plan view. Rotatably driving the swing shaft 210 by the rotation drive mechanism 212 allows moving any of the large-diameter polishing pad 222, the cleaning tool 232, the small-diameter polishing pad 242, and the photographing member 252 onto the substrate WF. Rotatably driving the swing shaft 210 by the rotation drive mechanism 212 allows moving the polishing pad 222 or the polishing pad 242 onto the dresser 500. The rotation drive mechanism 212 has a function of a swing mechanism that rotatably drives the swing shaft 210 clockwise and counterclockwise in alternation to swing the first arm 220, the second arm 230, the third arm 240, and the fourth arm 250. Specifically, the rotation drive mechanism 212 rotatably drives the swing shaft 210 clockwise and counterclockwise in alternation in a state where the polishing pad 222, the cleaning tool 232, or the polishing pad 242 are positioned on the substrate WF to allow the polishing pad 222 (the pad holder 226), the cleaning tool 232 (the cleaning tool holder 236), or the polishing pad 242 (the pad holder 246) to swing with respect to the substrate WF. While this embodiment shows an example in which the polishing pad 222, the cleaning tool 232, or the polishing pad 242 is turned and swung in the radial direction of the substrate WF, that is, moved in a reciprocating manner along an arc by the rotation drive mechanism 212, the configuration is not limited to this. For example, the swing mechanism can have a configuration that linearly swings the polishing pad 222, the cleaning tool 232, or the polishing pad 242 in the radial direction of the substrate, that is, moves it in a reciprocating manner along a straight line.

The multi-axis arm 200 includes a rotation drive mechanism, such as a motor (not illustrated), for rotating the rotation shafts 224, 234, 244. This allows the polishing pad 222, the cleaning tool 232, and the polishing pad 242 to rotate with the rotation shafts 224, 234, 244 as axes. For example, in a case where the polishing pad 222 is on the substrate WF, the substrate processing apparatus 1000 is configured to rotate the table 100 and rotate the polishing pad 222, and swing the polishing pad 222 by the rotation drive mechanism 212 while pushing the polishing pad 222 to the substrate WF by the elevating mechanism 227 to polish the substrate WF.

<Supporting Members>

As illustrated in FIG. 1 and FIG. 2, the substrate processing apparatus 1000 includes the first supporting member 300A arranged on a swing path of the polishing pad 222 outside the table 100 and the second supporting member 300B arranged on a swing path of the polishing pad 222 on a side opposite to the first supporting member 300A across the table 100. The first supporting member 300A and the second supporting member 300B are linearly symmetrical across the substrate WF. In view of this, the following will collectively describe the first supporting member 300A and the second supporting member 300B as supporting members 300. While the following will give a description on the function of the supporting members 300 in a case where the large-diameter polishing pad 222 is swung with respect to the substrate WF as an example, the same applies to the cleaning tool 232 or the small-diameter polishing pad 242.

The supporting members 300 are members for supporting the polishing pad 222 swung to outside the table 100 by the rotation of the swing shaft 210. That is, the substrate processing apparatus 1000 is configured to swing (overhang) the polishing pad 222 until the polishing pad 222 projects to the outside of the substrate WF when polishing the substrate WF to uniformly polish a surface to be polished of the substrate WF. Here, in a case where the polishing pad 222 is overhung, due to various factors, such as an inclination of the pad holder 226, a pressure of the polishing pad 222 concentrates on a periphery edge portion of the substrate WF, and the surface to be polished of the substrate WF may possibly fail to be uniformly polished. Therefore, the substrate processing apparatus 1000 in this embodiment includes the supporting members 300 for supporting the polishing pad 222 overhung to the outside of the substrate WF on both sides of the table 100.

Figure 4:
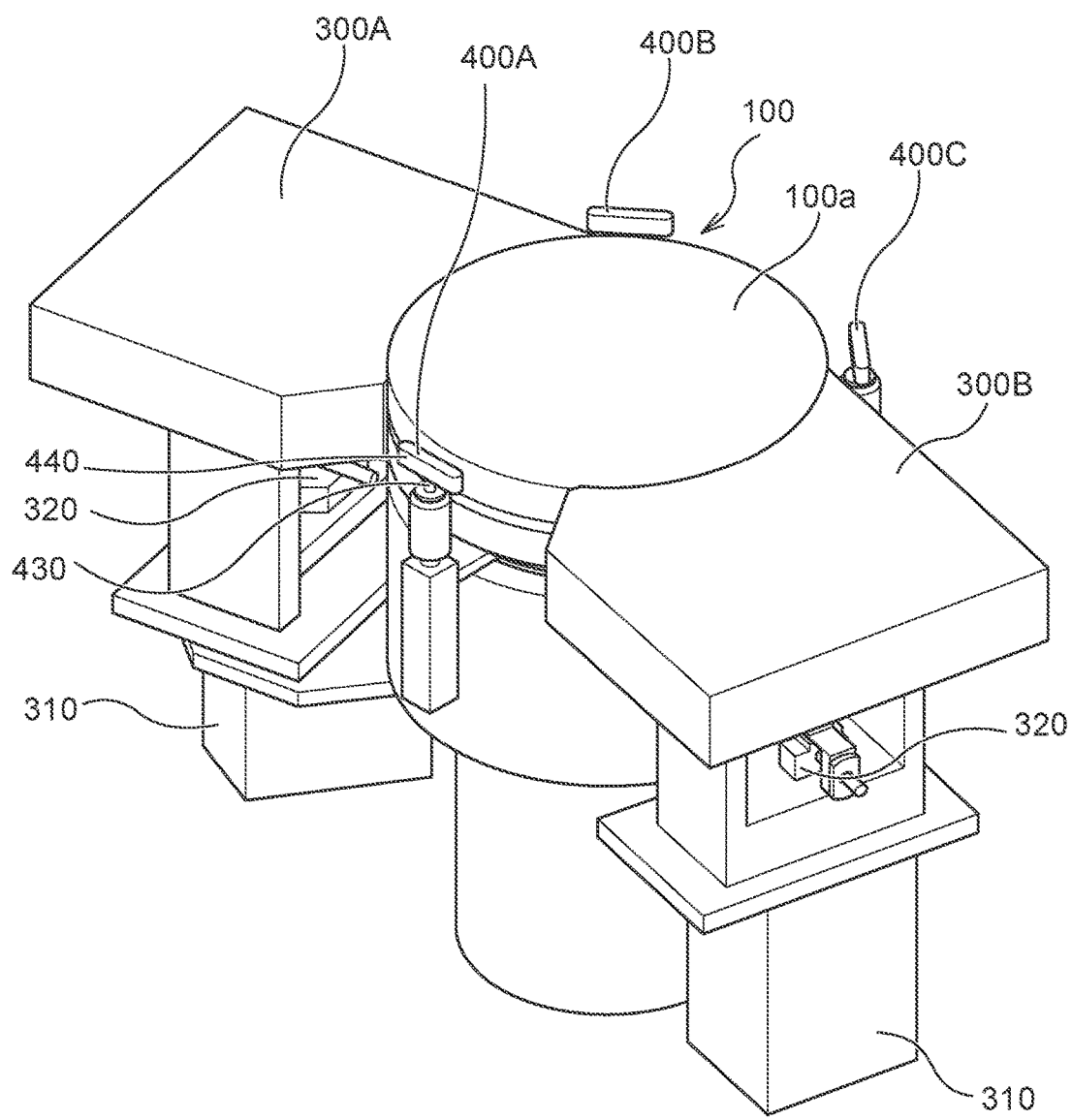
FIG. 4 is a perspective view schematically illustrating a table and supporting members according to the one embodiment.
Figure 5:
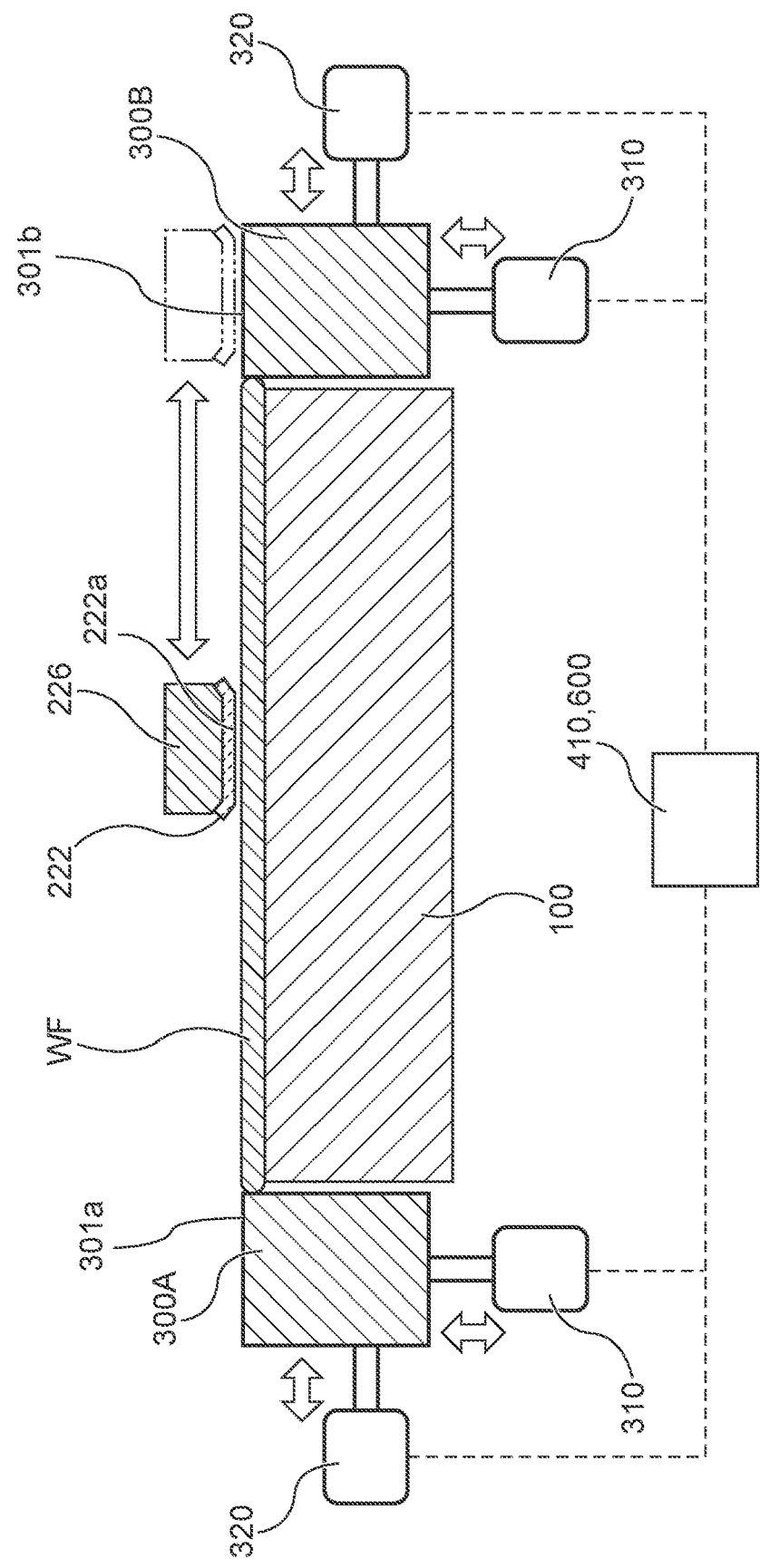
FIG. 5 is a side view schematically illustrating the table and the supporting members according to the one embodiment.

FIG. 4 is a perspective view schematically illustrating a table and supporting members according to the one embodiment. FIG. 5 is a side view schematically illustrating the table and the supporting members according to the one embodiment. As illustrated in FIG. 5, the first supporting member 300A and the second supporting member 300B respectively include support surfaces 301a, 301b that can support an entire polishing surface 222a of the polishing pad 222 in contact with the substrate WF. That is, the support surfaces 301a, 301b each have an area larger than an area of the polishing surface 222a of the polishing pad 222, and therefore even when the polishing pad 222 is overhung up to completely outside the substrate WF, the support surfaces 301a, 301b support the entire polishing surface 222a. Thus, in this embodiment, when the polishing pad 222 swings above the substrate WF, the entire polishing surface 222a is in contact with the substrate WF while being supported, and when the polishing pad 222 swings up to the outside of the table 100, the entire polishing surface 222a is supported by the supporting members 300. Accordingly, the polishing pad 222 does not protrude from the surface to be polished of the substrate WF or the regions of the support surfaces 301a, 301b during swinging.

<Driving Mechanism>

As illustrated in FIG. 4 and FIG. 5, the substrate processing apparatus 1000 includes driving mechanisms 310 for adjusting heights of the supporting members 300. The driving mechanisms 310 can be configured of various known mechanisms, such as a motor and a ball screw, and can adjust the supporting members 300 (the support surface 301a and the support surface 301b) so as to be desired heights. The substrate processing apparatus 1000 includes driving mechanisms 320 for adjusting distances of the supporting members 300 with respect to the substrate WF by adjusting positions of the supporting members 300 in the horizontal direction, namely positions along a radial direction of the substrate WF supported by the table 100. The driving mechanisms 320 can be configured of various mechanisms, such as a motor and a ball screw.

The driving mechanisms 320 can adjust the distances of the supporting members 300 with respect to the substrate WF installed on the table 100 based on the diameter of the substrate WF obtained by a method described later. For example, for uniformly polishing the surface to be polished of the substrate WF, absence of a gap between the substrate WF and the supporting members 300 is preferred. However, while the substrate WF rotates in association with the rotation of the table 100 during the polishing process, the supporting members 300 do not rotate, and therefore the supporting members 300 cannot contact the outer peripheral portion of the substrate WF. Therefore, the driving mechanisms 320 can arrange the supporting members 300 at positions close to the outer peripheral portion of the substrate WF as much as possible within a range not in contact with the outer peripheral portion of the substrate WF based on the obtained diameter of the substrate WF. In addition, the driving mechanisms 310, 320 can adjust heights and positions in the horizontal direction of the supporting members 300 according to a film thickness profile of the surface to be polished of the substrate WF obtained by the film thickness measuring instrument 600 described later.

<Centering Mechanism and Controller>

As illustrated in FIG. 1, FIG. 2, and FIG. 4, the substrate processing apparatus 1000 includes at least the three centering mechanisms 400A, 400B, 400C to push the substrate WF supported by the table 100 in the center direction of the table 100 for positioning. The centering mechanisms 400A, 400B, 400C are arranged in a peripheral area of the table 100 at appropriate intervals.

Figure 6:
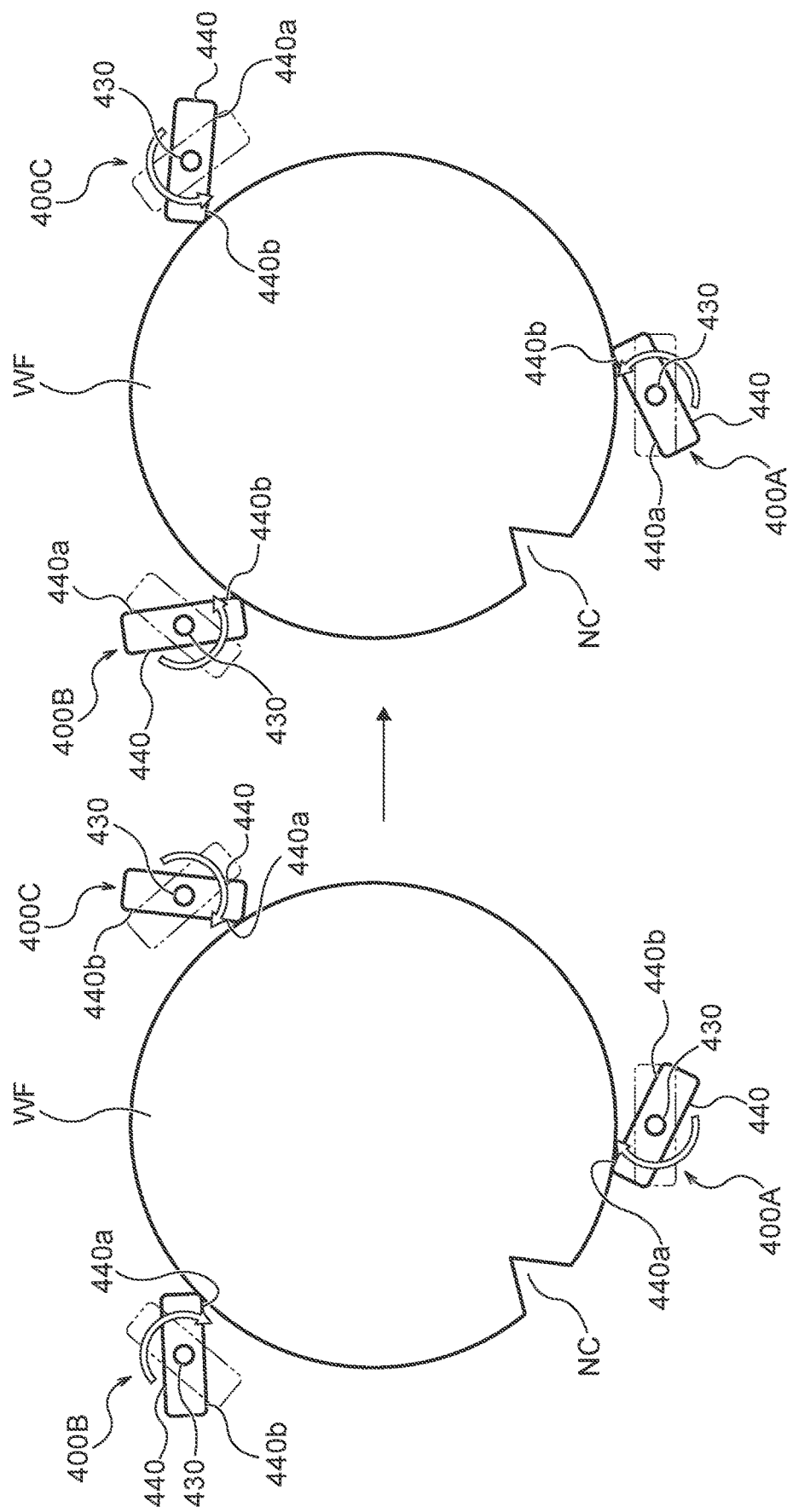
FIG. 6 is a plan view schematically illustrating centering mechanisms according to the one embodiment, and illustrates a case where centering members do not push a notch in a first positioning or a second positioning.

FIG. 6 is a plan view schematically illustrating centering mechanisms according to the one embodiment, and illustrates a case where the centering members do not push the notch in the first positioning or the second positioning. As illustrated in FIG. 6, the centering mechanisms 400A, 400B, 400C each include a rotation shaft 430 extending in the height direction and a centering member 440 mounted to the rotation shaft 430. The rotation shaft 430 is configured to be rotatable by a rotation drive mechanism, such as a motor (not illustrated). The centering member 440 is a rod-shaped member mounted to the rotation shaft 430 at a height position same as that of the table 100 or the substrate WF and extends to both sides of the rotation shaft 430. The centering member 440 includes a first contact portion 440a that is in contact with the substrate WF when the rotation shaft 430 rotates in a first direction (for example, the clockwise direction) and a second contact portion 440b that is in contact with the substrate WF when the rotation shaft 430 rotates in a second direction (for example, the anticlockwise direction) opposite to the first direction. In addition, the substrate processing apparatus 1000 includes a controller 410 for performing the positioning of the substrate WF using the centering mechanisms 400A, 400B, 400C.

The controller 410 performs a setting of initial positions of the rotation shafts 430 and the centering members 440 in a state where the substrate WF is not installed on the table 100. Specifically, the controller 410 rotates the rotation shafts 430 in a first direction until the first contact portions 440a are brought into contact with the outer periphery of the table 100 in a state where the substrate WF is not installed on the table 100. From this state, the controller 410 rotates the rotation shafts 430 in a second direction until the second contact portions 440b are brought into contact with the outer periphery of the table 100 and detects rotation angles in the second direction of the rotation shafts 430. Based on the detected rotation angles, the controller 410 sets the centers of the rotation ranges of the rotation shafts 430 and the centering members 440 as the initial positions of the rotation shafts 430 and the centering members 440. Note that, when setting the initial positions of the rotation shafts 430 and the centering members 440, damage to the rotation shafts 430 or the centering members 440 when contacting the table 100 can be suppressed by restricting an output torque of a motor that rotatably drives the rotation shafts 430 to be a predetermined value.

When the substrate WF is installed on the table 100, the controller 410 rotates the respective rotation shafts 430 of the centering mechanisms 400A, 400B, 400C in the first direction at the same timing to push the substrate WF with the first contact portions 440a. Then, the first contact portion 440a of the centering member closest to the substrate WF among the three centering members 440 pushes the substrate WF in the center direction of the table 100. Afterwards, the first contact portions 440a of the remaining centering members 440 also sequentially push the substrate WF in the center direction of the table 100, and as a result, the substrate WF is pushed in the center direction of the table 100 from the three directions. When the first contact portions 440a of the three centering members 440 equally push the substrate WF, the substrate WF is centered to the center position of the table 100 to be positioned. Hereinafter, the positioning of the substrate WF performed by rotating the rotation shafts 430 in the first direction will be referred to as a "first positioning."

After the first positioning is performed, the controller 410 rotates the rotation shafts 430 in the second direction and pushes the substrate WF with the second contact portions 440b so as to center the substrate WF to the center position of the table 100, thus ensuring the positioning. Hereinafter, the positioning of the substrate WF performed by rotating the rotation shafts 430 in the second direction will be referred to as a "second positioning."

That is, as illustrated in FIG. 6, considering a case where there is a notch (cutout) NC on an outer peripheral portion of the substrate WF, in a case where the notch NC is not in the proximity of the centering mechanisms 400A, 400B, 400C, the centering members 440 do not push the notch NC in the first positioning or the second positioning, and the positioning of the substrate WF is performed without a problem.

Figure 7:
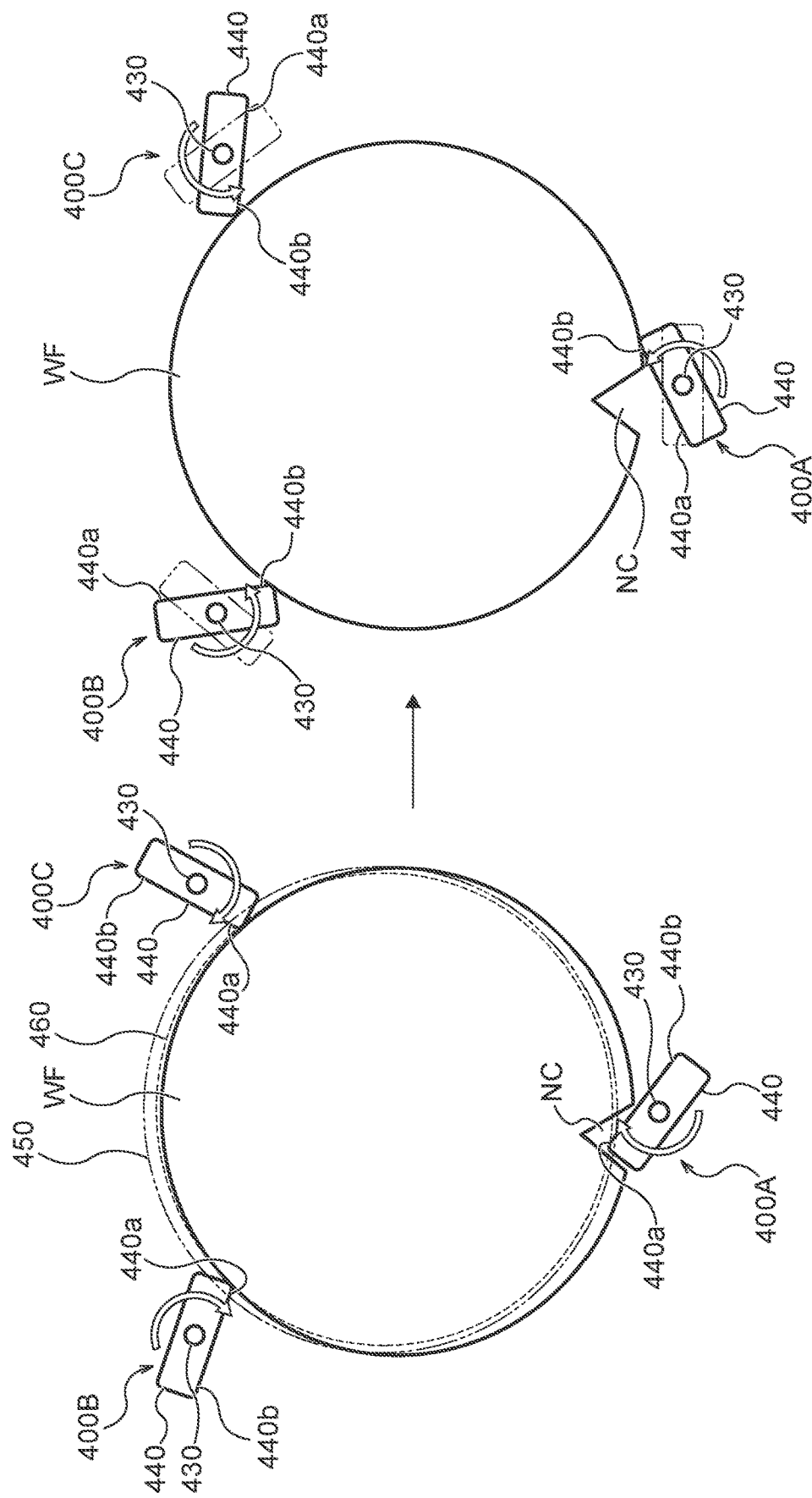
FIG. 7 is a plan view schematically illustrating the centering mechanisms according to the one embodiment, and illustrates a case where a centering member pushes the notch in the first positioning.

However, in this embodiment, since the substrate WF is not pre-aligned, the notch NC is arranged in a random position. Therefore, in a case where any of the three centering members 440 pushes the notch NC, the positioning of the substrate WF is displaced from the center of the table 100. FIG. 7 is a plan view schematically illustrating the centering mechanisms according to the one embodiment, and illustrates a case where a centering member pushes the notch in the first positioning. In the example illustrated in FIG. 7, since the first contact portion 440a of the centering member 440 of the centering mechanism 400A pushes the notch NC, the substrate WF is displaced from a position of a normal positioning indicated by the one-dot chain line 450. Therefore, in this embodiment, the controller 410 performs the second positioning after performing the first positioning. Accordingly, as illustrated in FIG. 7, the substrate WF is accurately positioned after the second positioning is performed.

Figure 8:
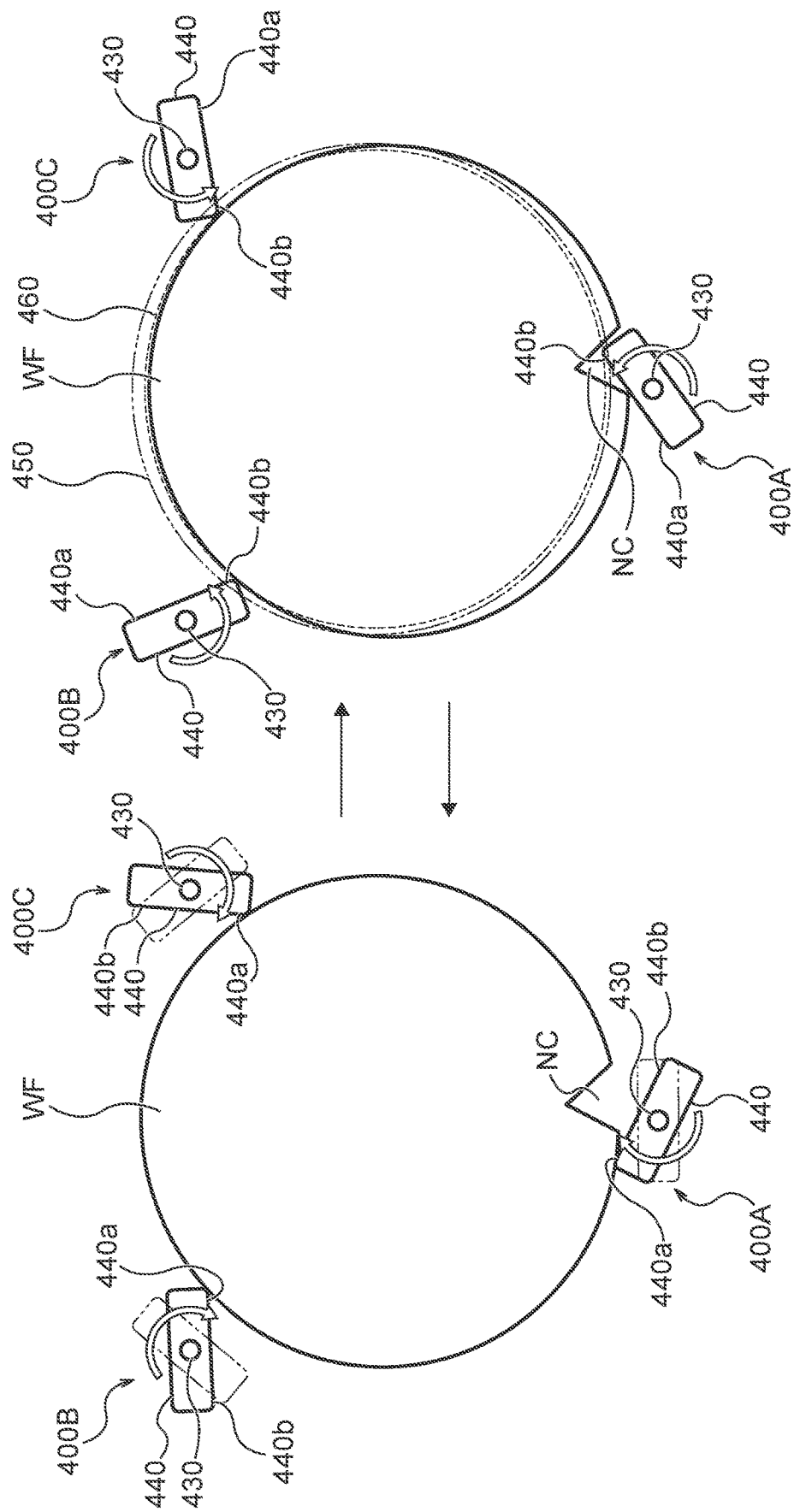
FIG. 8 is a plan view schematically illustrating the centering mechanisms according to the one embodiment, and illustrates a case where a centering member pushes the notch in the second positioning.

Meanwhile, there is also a possibility that the substrate WF is not accurately positioned in the second positioning. FIG. 8 is a plan view schematically illustrating the centering mechanisms in the one embodiment, and illustrates a case where a centering member pushes the notch in the second positioning. As illustrated in FIG. 8, there is a possibility that the positioning has been performed normally in the first positioning but a centering member 440 pushes the notch NC and causes a position displacement in the second positioning.

Therefore, the controller 410 in this embodiment is configured to determine a success or failure of the positioning of the substrate WF based on the rotation angles of the rotation shafts 430 when performing the first positioning and the rotation angles of the rotation shafts 430 when performing the second positioning. Specifically, the controller 410 compares first rotation angles from the initial positions of the rotation shafts 430 when performing the first positioning with second rotation angles from the initial positions of the rotation shafts 430 when performing the second positioning. In a case where the first rotation angles and the second rotation angles are equal, as illustrated in FIG. 6, it is considered that the centering members 440 did not push the notch NC when performing the first positioning or when performing the second positioning, and thus, the controller 410 is configured to determine that the positioning of the substrate WF has succeeded.

Meanwhile, in a case where the second rotation angles are smaller than the first rotation angles, as illustrated in FIG. 7, it is considered that a centering member 440 pushed the notch NC and caused a position displacement in the first positioning but the positioning was performed normally in the second positioning, and thus, the controller 410 is configured to determine that the positioning of the substrate WF has succeeded.

Meanwhile, as illustrated in FIG. 8, in a case where the second rotation angle is larger than the first rotation angle, it is considered that the positioning was performed normally in the first positioning but a centering member 440 pushed the notch NC and caused a position displacement in the second positioning, and thus, the controller 410 determines that the positioning of the substrate WF has failed. In this case, since any of the second contact portions 440b has pushed the notch NC of the substrate WF and the positioning of the substrate WF has become displaced in the second positioning, the controller 410 performs the first positioning again to center the substrate WF to the center position of the table 100.

In the centering member 440 in this embodiment, while either the first contact portion 440a or the second contact portion 440b may possibly push the notch NC, they are configured not to push the notch NC together. Therefore, according to this embodiment, even in a case where the notch NC is on the outer peripheral portion of the substrate WF, the substrate WF can be ensured to be positioned at the center position of the table 100. While this embodiment describes a case where the notch NC is formed in the substrate WF as an example, the substrate WF can be ensured to be positioned at the center position of the table 100 similarly in a case where an orientation flat (OF) is formed on the outer peripheral portion of the substrate WF. Based on the above, according to this embodiment, the positioning accuracy of the substrate WF including a deformed portion that is not pre-aligned can be improved.

<Calculation of Diameter of Substrate WF>

Next, a calculation of a diameter of the substrate WF based on the positioning of the substrate WF will be described. The controller 410 is configured to calculate the diameter of the substrate WF based on the rotation angles of the rotation shafts 430 when performing the first positioning and the rotation angles of the rotation shafts 430 when performing the second positioning. Specifically, the controller 410 includes a reference table for associating the rotation angles from the initial positions of the rotation shafts 430 with the diameter of the substrate WF. That is, although the substrate WF has the predetermined size determined by the standard, in actuality, the tolerance (variation) is present in the diameter of the substrate WF. Therefore, the controller 410 preliminarily creates and stores the reference table of the correspondence relation between the rotation angles of the rotation shafts 430 and the diameter of the substrate WF based on, for example, the rotation angles in the first direction and the rotation angles in the second direction of the rotation shafts 430 when the first contact portions 440a and the second contact portions 440b push the table 100 whose diameter is already known. The controller 410 derives a diameter corresponding to the rotation angles in the first direction and the rotation angles in the second direction of the rotation shafts 430 when the substrate WF is positioned based on the stored reference table, thus ensuring calculating the diameter of the substrate WF.

Specifically, the controller 410 calculates a first diameter of the substrate WF based on the rotation angles in the first direction from the initial positions of the rotation shafts 430 when the first positioning is performed and the reference table. Subsequently, the controller 410 calculates a second diameter of the substrate WF based on the rotation angles in the second direction from the initial positions of the rotation shafts 430 when the second positioning is performed and the reference table. As illustrated in FIG. 6, the controller 410 compares the first diameter with the second diameter, and in a case where both are equal, it is considered that the notch NC in the substrate WF has not been pushed either when the first positioning or the second positioning was performed, and therefore the controller 410 outputs either of the first diameter or the second diameter as the diameter of the substrate WF.

Meanwhile, in the example illustrated in FIG. 7, since a centering member 440 is pushing the notch NC in the first positioning, a diameter smaller than the exact diameter of the substrate WF is calculated as indicated by the dashed line 460. Therefore, in a case where the second diameter is larger than the first diameter, it is considered that the notch NC in the substrate WF is pushed when the first positioning is performed, and therefore the controller 410 outputs the second diameter as the diameter of the substrate WF.

Meanwhile, as illustrated in FIG. 8, in a case where the second diameter is smaller than the first diameter, it is considered that the notch NC in the substrate WF is pushed when the second positioning is performed, and thus, the controller 410 outputs the first diameter as the diameter of the substrate WF and performs the first positioning again. With this embodiment, the controller 410 can accurately calculate the diameter of the substrate WF using the rotation angles when the notch NC is not pushed among the rotation angles in the first direction and the rotation angles in the second direction of the rotation shafts 430.

<Dresser>

As illustrated in FIG. 1 and FIG. 2, the dresser 500 is arranged on turning passages of the polishing pads 222, 242 by the rotation of the swing shaft 210. Diamond particles or the like are firmly electrodeposited on the surface of the dresser 500. The dresser 500 is a member for dressing the polishing pads 222, 242. The dresser 500 is configured to be rotated by a rotation drive mechanism, such as a motor (not illustrated). Pure water can be supplied to the surface of the dresser 500 from a nozzle (not illustrated). The substrate processing apparatus 1000 rotates the dresser 500 while supplying pure water from the nozzle to the dresser 500, rotates the polishing pads 222, 242, and swings the polishing pads 222, 242 with respect to the dresser 500 while pushing the polishing pads 222, 242 to the dresser 500. Thus, the dresser 500 scrapes off the polishing pads 222, 242 to dress polishing surfaces of the polishing pads 222, 242.

<Film Thickness Measuring Instrument>

As illustrated in FIG. 1 and FIG. 2, the substrate processing apparatus 1000 includes the film thickness measuring instrument 600 for measuring a film thickness profile of the surface to be polished of the substrate WF while polishing the substrate WF. The film thickness measuring instrument 600 can be configured of various sensors, such as an eddy current sensor or an optical sensor. As illustrated in FIG. 1, a rotation shaft 610 that extends in the height direction is arranged adjacent to the table 100. The rotation shaft 610 is rotatable about an axis of the rotation shaft 610 by a rotation drive mechanism, such as a motor (not illustrated). The rotation shaft 610 includes a swing arm 620, and the film thickness measuring instrument 600 is mounted on a distal end of the swing arm 620. The film thickness measuring instrument 600 is configured to pivotally swing about the axis of the rotation shaft 610 by the rotation of the rotation shaft 610. Specifically, the film thickness measuring instrument 600 can swing along the radial direction of the substrate WF by the rotation of the rotation shaft 610 during polishing of the substrate WF. The film thickness measuring instrument 600 is configured to swing to a position moved away from above the substrate WF while the polishing pad 222 is swinging above the substrate WF, and to swing above the substrate WF while the polishing pad 222 is not swinging above the substrate WF. That is, the film thickness measuring instrument 600 is allowed to swing above the substrate WF at timings where it does not interfere with the polishing pad 222 swinging above the substrate WF, and can measure the film thickness profile of the substrate WF polished by the polishing pad 222 over time. The film thickness measuring instrument 600 can detect an ending point of the polishing of the substrate WF when the measured film thickness profile of the substrate WF reaches a desired film thickness profile.

<Cleaning Nozzle>

As illustrated in FIG. 1 and FIG. 2, the cleaning nozzles 700A and 700B are arranged adjacent to the table 100. The cleaning nozzle 700A is configured to supply cleaning liquid, such as pure water, to a gap between the table 100 and the supporting member 300A. This ensures washing away polishing dust and the like entered between the table 100 and the supporting member 300A. The cleaning nozzle 700B is configured to supply cleaning liquid, such as pure water, to a gap between the table 100 and the supporting member 300B. This ensures washing away polishing dust and the like entered between the table 100 and the supporting member 300B.

<Flowchart>

Figure 9:
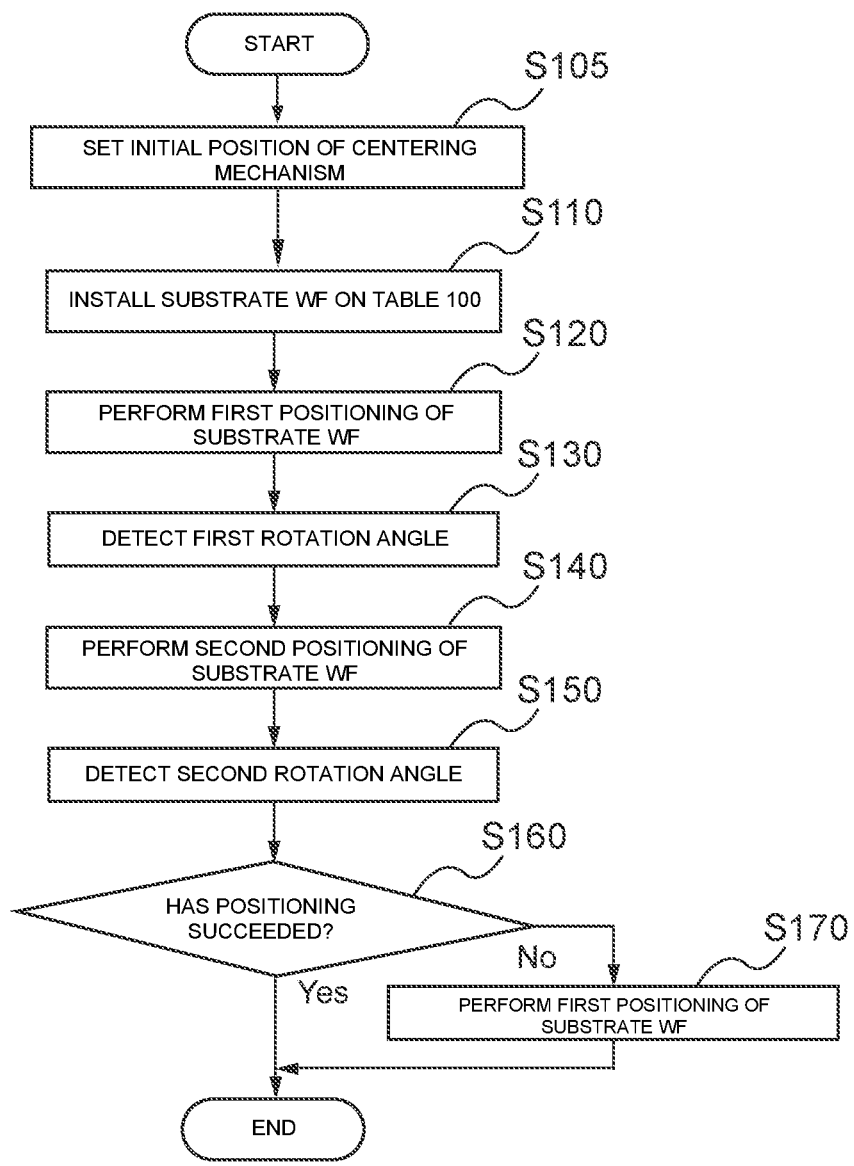
FIG. 9 is a flowchart depicting a substrate processing method according to the one embodiment.

Next, a procedure of the substrate processing method including the positioning of the substrate WF according to this embodiment will be described. FIG. 9 is a flowchart depicting a procedure of the positioning of the substrate according to one embodiment. As illustrated in FIG. 9, the substrate processing method first sets the initial positions of the centering mechanisms 400A, 400B, 400C according to the controller 410 (initial setting step S105). Subsequently, the substrate processing method installs the substrate WF on the table 100 (installing step S110). Subsequently, the substrate processing method performs the first positioning of the substrate WF according to the controller 410 (first positioning step S120). Subsequently, the substrate processing method detects the first rotation angles from the initial positions of the rotation shafts 430 in the first positioning step S120 according to the controller 410 (step S130). Subsequently, the substrate processing method performs the second positioning of the substrate WF according to the controller 410 (second positioning step S140). Subsequently, the substrate processing method detects the second rotation angles from the initial positions of the rotation shafts 430 in the second positioning step S140 according to the controller 410 (step S150).

Subsequently, the substrate processing method determines the success or failure of the positioning of the substrate WF based on the rotation angles of the rotation shafts 430 when performing the first positioning and the rotation angles of the rotation shafts 430 when performing the second positioning according to the controller 410 (determining step S160). Specifically, the controller 410 compares the first rotation angles with the second rotation angles, and in a case where the first rotation angles and the second rotation angles are equal, or in a case where the second rotation angles are smaller than the first rotation angles, determines that the positioning of the substrate WF has succeeded (step S160, Yes) and terminates the positioning process of the substrate WF.

Meanwhile, in a case where the second rotation angle is larger than the first rotation angle, the controller 410 determines that the positioning of the substrate WF has failed (step S160, No). In this case, the substrate processing method performs the first positioning step again using the controller 410 (step S170) and terminates the positioning process of the substrate WF. According to this embodiment, the positioning accuracy of the substrate WF including a deformed portion that is not pre-aligned can be improved.

Figure 10:
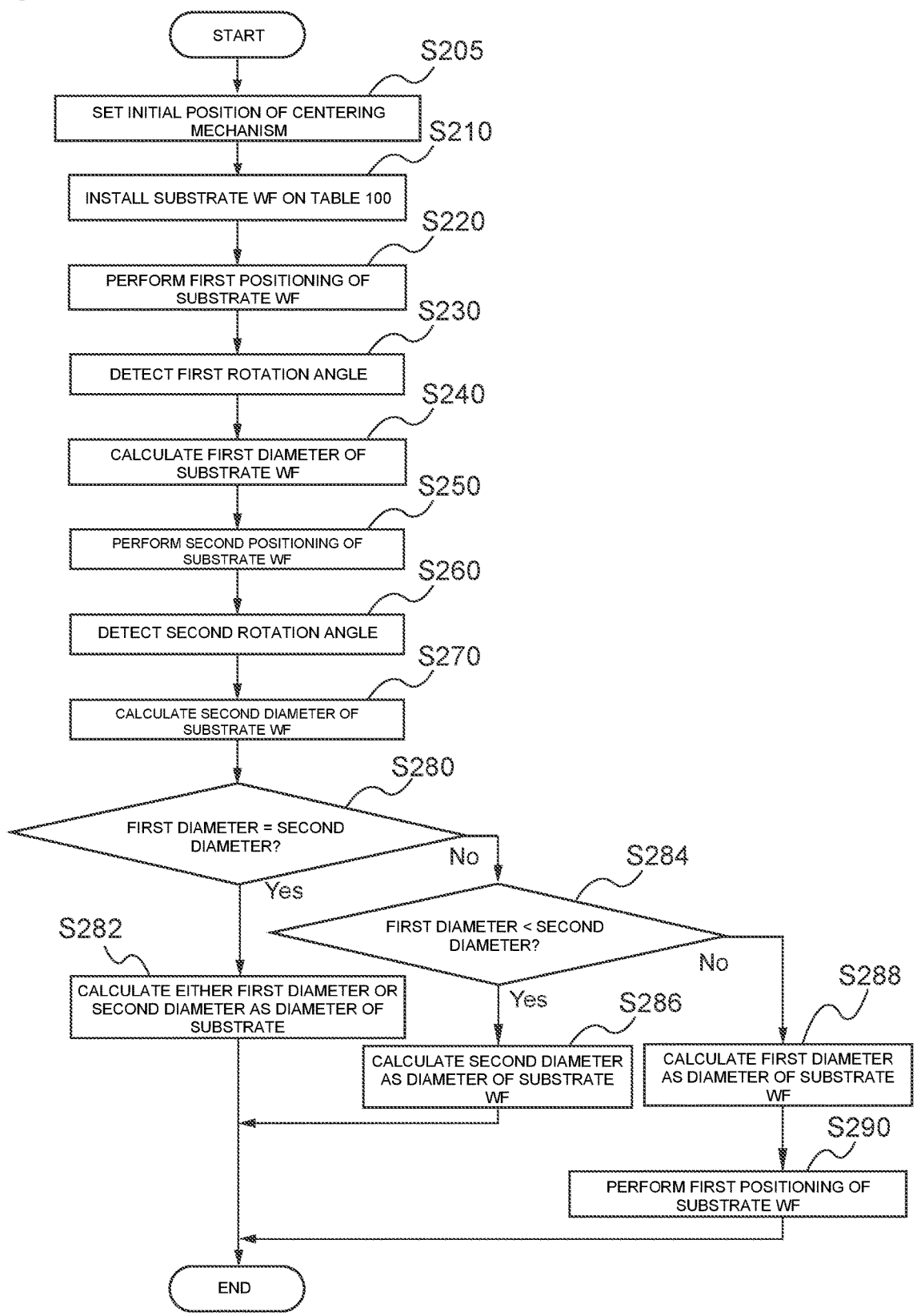
FIG. 10 is a flowchart depicting a substrate processing method according to the one embodiment.

FIG. 10 is a flowchart depicting a procedure of the positioning and a calculation of a diameter of the substrate according to one embodiment. As illustrated in FIG. 10, the substrate processing method first sets the initial positions of the centering mechanisms 400A, 400B, 400C according to the controller 410 (initial setting step S205). Subsequently, the substrate processing method installs the substrate WF on the table 100 (installation step S210). Subsequently, the substrate processing method performs the first positioning of the substrate WF according to the controller 410 (first positioning step S220). Subsequently, the substrate processing method detects the first rotation angles from the initial positions of the rotation shafts 430 in the first positioning step S220 according to the controller 410 (step S230). Subsequently, the substrate processing method calculates the first diameter based on the first rotation angles and the reference table according to the controller 410 (step S240).

Subsequently, the substrate processing method performs the second positioning of the substrate WF according to the controller 410 (second positioning step S250). Subsequently, the substrate processing method detects the second rotation angles from the initial positions of the rotation shafts 430 in the second positioning step S250 according to the controller 410 (step S260). Subsequently, the substrate processing method calculates the second diameter based on the second rotation angles and the reference table according to the controller 410 (step S270).

Subsequently, the substrate processing method determines whether the first diameter and the second diameter are equal according to the controller 410 (step S280). In a case where the first diameter and the second diameter are determined to be equal (step S280, Yes), the substrate processing method calculates either the first diameter or the second diameter as the diameter of the substrate WF (step S282), and terminates the process. Meanwhile, in a case where the first diameter and the second diameter are determined to be unequal (step S280, No), the substrate processing method determines whether the second diameter is larger than the first diameter according to the controller 410 (step S284). In a case where the second diameter is determined to be larger than the first diameter (step S284, Yes), the substrate processing method calculates the second diameter as the diameter of the substrate WF (step S286), and terminates the process. Meanwhile, in a case where the second diameter is determined to be smaller than the first diameter (step S284, No), the substrate processing method calculates the first diameter as the diameter of the substrate WF (step S288), performs the first positioning of the substrate WF again (step S290), and terminates the process. With this embodiment, the positioning accuracy of the substrate WF including a deformed portion that is not pre-aligned can be improved, and the diameter of the substrate WF can be calculated accurately.

In the foregoing, several embodiments of the present invention have been described in order to facilitate understanding of the present invention without limiting the present invention. The present invention can be changed or improved without departing from the gist thereof, and of course, the equivalents of the present invention are included in the present invention. It is possible to arbitrarily combine or omit respective components described in the claims and specification in a range in which at least a part of the above-described problems can be solved, or a range in which at least a part of the effects can be exhibited.

This application discloses a substrate processing apparatus as one embodiment that includes a table, a pad holder, an elevating mechanism, and at least three centering mechanisms. The table is for supporting a substrate. The pad holder is for holding a polishing pad for polishing the substrate supported by the table. The elevating mechanism is for elevating the pad holder with respect to the substrate. The at least three centering mechanisms are for pushing the substrate supported by the table in a center direction of the table to position the substrate. The at least three centering mechanisms each include a rotation shaft arranged in a peripheral area of the table and a centering member mounted to the rotation shaft. The centering member includes a first contact portion configured to contact the substrate when the rotation shaft rotates in a first direction and a second contact portion configured to contact the substrate when the rotation shaft rotates in a second direction opposite to the first direction.

Further, this application discloses a substrate processing apparatus as one embodiment that further includes a controller configured to perform a first positioning by rotating the rotation shafts in the first direction to push the substrate with the first contact portions, and subsequently perform a second positioning by rotating the rotation shafts in the second direction to push the substrate with the second contact portions.

Further, this application discloses a substrate processing apparatus as one embodiment in which the controller is configured to determine a success or failure of the positioning based on rotation angles of the rotation shafts when performing the first positioning and rotation angles of the rotation shafts when performing the second positioning.

Further, this application discloses a substrate processing apparatus as one embodiment in which the controller is configured to compare first rotation angles from initial positions of the rotation shafts when performing the first positioning with second rotation angles from the initial positions of the rotation shafts when performing the second positioning, so as to determine that the positioning has succeeded when the first rotation angles and the second rotation angles are equal or when the second rotation angle is smaller than the first rotation angle.

Further, this application discloses a substrate processing apparatus as one embodiment in which the controller is configured such that the controller determines that the positioning has failed and performs the first positioning again when the second rotation angle is larger than the first rotation angle.

Further, this application discloses a substrate processing apparatus as one embodiment in which the controller is configured to calculate a diameter of the substrate based on the rotation angles of the rotation shafts when performing the first positioning and the rotation angles of the rotation shafts when performing the second positioning.

Further, this application discloses a substrate processing apparatus as one embodiment in which the controller includes a reference table for associating the rotation angles from the initial positions of the rotation shafts with the diameter of the substrate, and the controller is configured to calculate the diameter of the substrate based on the first rotation angles from the initial positions of the rotation shafts when performing the first positioning, the second rotation angles from the initial positions of the rotation shafts when performing the second positioning, and the reference table.

Further, this application discloses a substrate processing apparatus as one embodiment in which the controller is configured to calculate a first diameter based on the first rotation angles and the reference table, calculate a second diameter based on the second rotation angles and the reference table, compare the first diameter with the second diameter, and calculate either the first diameter or the second diameter as the diameter of the substrate when the first diameter and the second diameter are equal.

Further, this application discloses a substrate processing apparatus as one embodiment in which the controller is configured such that the controller calculates the second diameter as the diameter of the substrate when the second diameter is larger than the first diameter.

Further, this application discloses a substrate processing apparatus as one embodiment in which the controller is configured such that the controller calculates the first diameter as the diameter of the substrate and performs the first positioning again when the second diameter is smaller than the first diameter.

Further, this application discloses a substrate processing method as one embodiment that includes an installing step of installing a substrate on a table, and a positioning step of positioning the substrate installed on the table by pushing the substrate in a center direction of the table, in which the positioning step is performed using at least three centering mechanisms that each include a rotation shaft arranged in a peripheral area of the table and a centering member mounted to the rotation shaft, and the positioning step includes a first positioning step of rotating the rotation shafts in a first direction to push the substrate with first contact portions of the centering members, and a second positioning step of rotating the rotation shafts in a second direction opposite to the first direction to push the substrate with second contact portions of the centering members after the first positioning step.

Further, this application discloses a substrate processing method as one embodiment that further includes a determining step of determining a success or failure of the positioning based on rotation angles of the rotation shafts when performing the first positioning and rotation angles of the rotation shafts when performing the second positioning.

Further, this application discloses a substrate processing method as one embodiment that further includes a step of detecting first rotation angles from initial positions of the rotation shafts when performing the first positioning and a step of detecting second rotation angles from the initial positions of the rotation shafts when performing the second positioning. The determining step includes comparing the first rotation angles with the second rotation angles and determining that the positioning has succeed when the first rotation angles and the second rotation angles are equal or when the second rotation angle is smaller than the first rotation angle.

Further, this application discloses a substrate processing method as one embodiment in which the determining step includes determining that the positioning has failed and performing the first positioning step again when the second rotation angle is larger than the first rotation angle.

Further, this application discloses a substrate processing method as one embodiment that further includes a diameter calculating step of calculating a diameter of the substrate based on the rotation angles of the rotation shafts when performing the first positioning step, and the rotation angles of the rotation shafts when performing the second positioning step.

Further, this application discloses a substrate processing method as one embodiment that further includes a step of detecting the first rotation angles from the initial positions of the rotation shafts when performing the first positioning; and a step of detecting the second rotation angles from the initial positions of the rotation shafts when performing the second positioning. The diameter calculating step includes calculating the diameter of the substrate based on the first rotation angles, the second rotation angles, and a reference table for associating the rotation angles from the initial positions of the rotation shafts with the diameter of the substrate.

Further, this application discloses a substrate processing method as one embodiment in which the diameter calculating step includes a step of calculating a first diameter based on the first rotation angles and the reference table and a step of calculating a second diameter based on the second rotation angles and the reference table, and the diameter calculating step includes comparing the first diameter with the second diameter and calculating either the first diameter or the second diameter as the diameter of the substrate when the first diameter and the second diameter are equal.

Further, this application discloses a substrate processing method as one embodiment in which the diameter calculating step includes calculating the second diameter as the diameter of the substrate when the second diameter is larger than the first diameter.

Further, this application discloses a substrate processing method as one embodiment in which the diameter calculating step includes calculating the first diameter as the diameter of the substrate and performing the first positioning step again when the second diameter is smaller than the first diameter.

REFERENCE SIGNS LIST

100 . . . table
222 . . . polishing pad
226 . . . pad holder
227 . . . elevating mechanism
400A, 400B, 400C . . . centering mechanism
410 . . . controller
430 . . . rotation shaft
440 . . . centering member
440*a* . . . first contact portion
440*b* . . . second contact portion
1000 . . . substrate processing apparatus
NC . . . notch
WF . . . substrate

What is claimed is:

1. A substrate processing apparatus comprising:
a table for supporting a substrate;
a pad holder for holding a polishing pad for polishing the substrate supported by the table;
an elevating mechanism for elevating the pad holder with respect to the substrate; and
at least three centering mechanisms for pushing the substrate supported by the table in a center direction of the table to position the substrate, wherein
the at least three centering mechanisms each include a rotation shaft arranged in a peripheral area of the table and a centering member mounted to the rotation shaft, and
the centering member includes a first contact portion configured to contact the substrate when the rotation shaft rotates in a first direction and a second contact portion configured to contact the substrate when the rotation shaft rotates in a second direction opposite to the first direction,
wherein the substrate processing apparatus further comprises a controller configured to perform a first positioning by rotating the rotation shafts in the first direction to push the substrate with the first contact portions, and subsequently perform a second positioning by rotating the rotation shafts in the second direction to push the substrate with the second contact portions,
wherein the controller is configured to determine a success or failure of the first positioning and the second positioning based on rotation angles of the rotation shafts when performing the first positioning and rotation angles of the rotation shafts when performing the second positioning, and
wherein the controller is configured to compare first rotation angles from initial positions of the rotation shafts when performing the first positioning with second rotation angles from the initial positions of the rotation shafts when performing the second positioning, so as to determine that the second positioning has succeeded when the first rotation angles and the second rotation angles are equal or when the second rotation angles are smaller than the first rotation angles.

2. A substrate processing apparatus comprising:
a table for supporting a substrate;
a pad holder for holding a polishing pad for polishing the substrate supported by the table;
an elevating mechanism for elevating the pad holder with respect to the substrate; and
at least three centering mechanisms for pushing the substrate supported by the table in a center direction of the table to position the substrate, wherein
the at least three centering mechanisms each include a rotation shaft arranged in a peripheral area of the table and a centering member mounted to the rotation shaft, and
the centering member includes a first contact portion configured to contact the substrate when the rotation shaft rotates in a first direction and a second contact portion configured to contact the substrate when the rotation shaft rotates in a second direction opposite to the first direction,
wherein the substrate processing apparatus further comprises a controller configured to perform a first positioning by rotating the rotation shafts in the first direction to push the substrate with the first contact portions, and subsequently perform a second positioning by rotating the rotation shafts in the second direction to push the substrate with the second contact portions,
wherein the controller is configured to determine a success or failure of the first positioning and the second positioning based on rotation angles of the rotation shafts when performing the first positioning and rotation angles of the rotation shafts when performing the second positioning,
wherein the controller is configured to compare first rotation angles from initial positions of the rotation shafts when performing the first positioning with second rotation angles from the initial positions of the rotation shafts when performing the second positioning, and
wherein the controller is configured such that the controller determines that the second positioning has failed and performs the first positioning again when the second rotation angles are larger than the first rotation angles.

3. A substrate processing apparatus comprising:
a table for supporting a substrate;
a pad holder for holding a polishing pad for polishing the substrate supported by the table;
an elevating mechanism for elevating the pad holder with respect to the substrate; and
at least three centering mechanisms for pushing the substrate supported by the table in a center direction of the table to position the substrate, wherein
the at least three centering mechanisms each include a rotation shaft arranged in a peripheral area of the table and a centering member mounted to the rotation shaft, and the centering member includes a first contact portion configured to contact the substrate when the rotation shaft rotates in a first direction and a second contact portion configured to contact the substrate when the rotation shaft rotates in a second direction opposite to the first direction, wherein the substrate processing apparatus further comprises a controller configured to perform a first positioning by rotating the rotation shafts in the first direction to push the substrate with the first contact portions, and subsequently perform a second positioning by rotating the rotation shafts in the second direction to push the substrate with the second contact portions,
wherein the controller is configured to compare first rotation angles from initial positions of the rotation shafts when performing the first positioning with second rotation angles from the initial positions of the rotation shafts when performing the second positioning, and
wherein the controller is configured to calculate a diameter of the substrate based on the first rotation angles of the rotation shafts when performing the first positioning and the second rotation angles of the rotation shafts when performing the second positioning.

4. The substrate processing apparatus according to claim 3, wherein
the controller includes a reference table for associating the first rotation angles from the initial positions of the rotation shafts and the second rotation angles from the initial position of the rotation shafts with the diameter of the substrate, and
the controller is configured to calculate the diameter of the substrate based on the first rotation angles from the initial positions of the rotation shafts when performing the first positioning, the second rotation angles from the initial positions of the rotation shafts when performing the second positioning, and the reference table.

5. The substrate processing apparatus according to claim 4, wherein
the controller is configured to calculate a first diameter based on the first rotation angles and the reference table, calculate a second diameter based on the second rotation angles and the reference table, compare the first diameter with the second diameter, and calculate either the first diameter or the second diameter as the diameter of the substrate when the first diameter and the second diameter are equal.

6. The substrate processing apparatus according to claim 5, wherein
the controller is configured such that the controller calculates the second diameter as the diameter of the substrate when the second diameter is larger than the first diameter.

7. The substrate processing apparatus according to claim 5, wherein
the controller is configured such that the controller calculates the first diameter as the diameter of the substrate and performs the first positioning again when the second diameter is smaller than the first diameter.

8. A substrate processing method comprising:
an installing step of installing a substrate on a table; and
a positioning step of positioning the substrate installed on the table by pushing the substrate in a center direction of the table, wherein
the positioning step is performed using at least three centering mechanisms that each include a rotation shaft arranged in a peripheral area of the table and a centering member mounted to the rotation shaft, and
the positioning step includes:
a first positioning step of rotating the rotation shafts in a first direction to push the substrate with first contact portions of the centering members; and
a second positioning step of rotating the rotation shafts in a second direction opposite to the first direction to push the substrate with second contact portions of the centering members after the first positioning step,
wherein the substrate processing method further comprises:
a determining step of determining a success or failure of the first positioning step and the second positioning step based on rotation angles of the rotation shafts when performing the first positioning and rotation angles of the rotation shafts when performing the second positioning;
a step of detecting first rotation angles from initial positions of the rotation shafts when performing the first positioning; and
a step of detecting second rotation angles from the initial positions of the rotation shafts when performing the second positioning, wherein
the determining step includes comparing the first rotation angles with the second rotation angles and determining that the second positioning has succeeded when the first rotation angles and the second rotation angles are equal or when the second rotation angles are smaller than the first rotation angles.

9. A substrate processing method comprising:
an installing step of installing a substrate on a table; and
a positioning step of positioning the substrate installed on the table by pushing the substrate in a center direction of the table, wherein
the positioning step is performed using at least three centering mechanisms that each include a rotation shaft arranged in a peripheral area of the table and a centering member mounted to the rotation shaft, and
the positioning step includes:
a first positioning step of rotating the rotation shafts in a first direction to push the substrate with first contact portions of the centering members; and
a second positioning step of rotating the rotation shafts in a second direction opposite to the first direction to push the substrate with second contact portions of the centering members after the first positioning step,
wherein the substrate processing method further comprises:
a determining step of determining a success or failure of the first positioning step and the second positioning step based on rotation angles of the rotation shafts when performing the first positioning and rotation angles of the rotation shafts when performing the second positioning; and
a step of detecting first rotation steps from initial positions of the rotation shafts when performing the first positioning; and
a step of detecting second rotation angles from the initial positions of the rotation shafts when performing the second positioning,
wherein the determining step includes determining that the second positioning step has failed and performing the first positioning step again when the second rotation angles are larger than the first rotation angles.

10. A substrate processing method comprising:
an installing step of installing a substrate on a table; and
a positioning step of positioning the substrate installed on the table by pushing the substrate in a center direction of the table, wherein
the positioning step is performed using at least three centering mechanisms that each include a rotation shaft arranged in a peripheral area of the table and a centering member mounted to the rotation shaft, and
the positioning step includes:
a first positioning step of rotating the rotation shafts in a first direction to push the substrate with first contact portions of the centering members; and
a second positioning step of rotating the rotation shafts in a second direction opposite to the first direction to push the substrate with second contact portions of the centering members after the first positioning step, wherein the substrate processing method further comprises:
a step of detecting first rotation angles from initial positions of the rotation shafts when performing the first positioning;
a step of detecting second rotation angles from the initial positions of the rotation shafts when performing the second positioning, and
a diameter calculating step of calculating a diameter of the substrate based on the first rotation angles of the rotation shafts when performing the first positioning step and the second rotation angles of the rotation shafts when performing the second positioning step.

11. The method according to claim 10, further comprising wherein
the diameter calculating step includes calculating the diameter of the substrate based on the first rotation angles, the second rotation angles, and a reference table for associating the first rotation angles from the initial positions of the rotation shafts and the second rotation angles from the initial positions of the rotation shafts with the diameter of the substrate.

12. The method according to claim 11, wherein the diameter calculating step includes a step of calculating a first diameter based on the first rotation angles and the reference table and a step of calculating a second diameter based on the second rotation angles and the reference table, and the diameter calculating step includes comparing the first diameter with the second diameter and calculating either the first diameter or the second diameter as the diameter of the substrate when the first diameter and the second diameter are equal.

13. The method according to claim 12, wherein
the diameter calculating step includes calculating the second diameter as the diameter of the substrate when the second diameter is larger than the first diameter.

14. The method according to claim 12, wherein
the diameter calculating step includes calculating the first diameter as the diameter of the substrate and performing the first positioning step again when the second diameter is smaller than the first diameter.

* * * * *